United States Patent [19]
Petersen

[11] 3,991,410
[45] Nov. 9, 1976

[54] ANALOG STORAGE CIRCUIT INCLUDING A PIEZOELECTRIC ELEMENT

[75] Inventor: August Petersen, Henstedt-Ulzburg, Germany

[73] Assignee: U.S. Philips Corporation, New York, N.Y.

[22] Filed: Apr. 2, 1975

[21] Appl. No.: 564,326

[30] Foreign Application Priority Data
Apr. 4, 1974    Germany............................ 2416459

[52] U.S. Cl.............................. 340/173.2; 333/29
[51] Int. Cl.²........................................ G11C 11/22
[58] Field of Search................................ 340/173.2

[56] References Cited
UNITED STATES PATENTS
3,890,604    6/1975    Schroder......................... 340/173.2

Primary Examiner—Terrell W. Fears
Attorney, Agent, or Firm—Frank R. Trifari; Ronald L. Drumheller

[57] ABSTRACT

A phase sensitive output circuit is used at an output of a piezoferroelectric storage element driven by an alternating voltage so that the storage range of the element is practically doubled.

6 Claims, 2 Drawing Figures

ANALOG STORAGE CIRCUIT INCLUDING A PIEZOELECTRIC ELEMENT

The invention relates to an analog storage circuit including a piezoferroelectric storage element having a driving electrode coupled to an alternating-voltage driving circuit and a storage electrode coupled to an input of an output circuit 25, which output circuit enables an output voltage to be obtained which is determined by a local state of polarization of the storage element.

German "Auslegeschrift" 2,003,396 describes such an analog storage circuit in which the output circuit drives a peak detector from which a direct voltage is obtained which permits, for example, the amplification factor of an amplifier in a television receiver to be adjusted. In such a circuit care must be taken to ensure that the state of polarization of the storage element lies within given limits, because otherwise no unambiguous output voltage is obtained.

It is an object of the present invention to eliminate the said disadvantage.

For this purpose an analog storage circuit of the aforementioned type is characterized in that the output circuit is a phase-sensitive circuit which has a further input which is coupled to the alternating-voltage driving circuit.

This not only provides the advantage that no limits of the polarization state of the storage element need be taken into account but also enables a far greater output voltage to be obtained so that the sensitivity of the circuit to interference is reduced.

Figure 1:
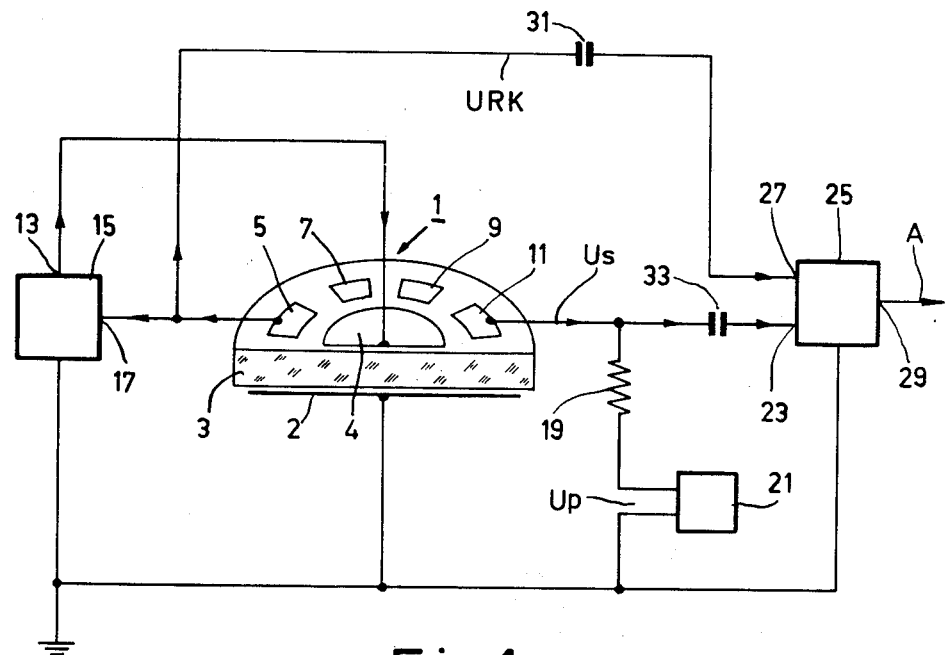
Figure 2:
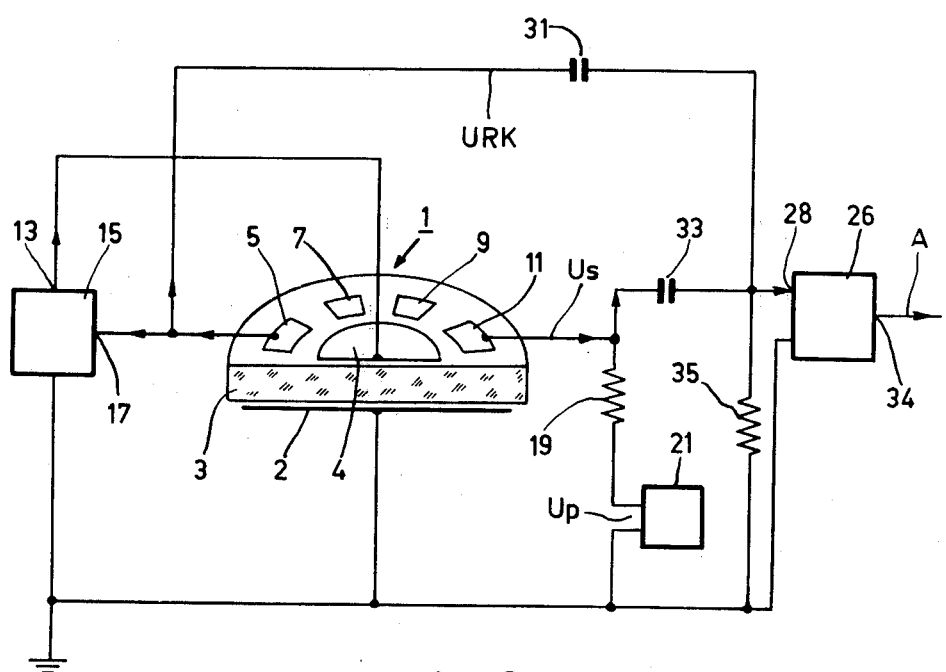

Embodiments of the invention will be described, by way of example, with reference to the accompanying diagrammatic drawings, in which:

FIG. 1 shows schematically an embodiment of an analog storage circuit according to the invention, and FIG. 2 shows schematically another embodiment of a storage circuit according to the invention.

Referring now to FIG. 1, a piezoferroelectric element 1 on one of its major surfaces is provided with a common electrode 2 which is connected to a common reference point, for example earth. The electrode 2 may be in one piece or comprise a plurality of parts.

The piezoferroelectric element 1 further comprises, for example, a thin disk 3 made of a ceramic material known under the trade name PXE 900. The disk may have a diameter of about 10 mm and be 0.15 mm thick. On its upper major surface the disk 3 is provided with electrodes 4, 5, 7, 9 and 11, the electrode 4 being the driving or oscillator electrode disposed concentrically at the centre. The electrode 4 is connected to an output 13 of an oscillator 15. The electrode 5 is a feedback electrode which is connected to a feedback signal input 17 of the oscillator 15. The electrodes 7, 9 and 11 are storage electrodes. The storage electrode 11 is connected via a resistor 19, which may have a value of, say, 500 megohms, to an output terminal of a polarizing and depolarizing voltage supply 21. The other output terminal of the voltage supply 21 is connected to earth. If the part of the ceramic disk 3 under the storage electrode 11 is fully polarized, with the oscillator connected in circuit an alternating voltage US can be measured at an input terminal 23 of an output circuit 25, which terminal is connected to the electrode 11. The feedback electrode 5 is connected to a further input terminal 27 of the output circuit 25. The output circuit 25 may, for example, be a differential amplifier. If the part of the disk 3 under the feedback electrode 5 also is fully polarized, an alternating voltage URK of equal value to alternating voltage US can be detected at the terminal 27. Thus in the state described the two alternating voltages at the terminals 23 and 27 of the differential amplifier 25 are equal so that the difference between the terminals 23 and 27 is zero. Hence no output voltage is produced at an output 29 of the differential amplifier 25.

If now the output voltage UP of the voltage supply 21 is varied in a negative direction, i.e. if the state of polarization of the part of the disk 3 under the storage electrode 11 is changed, the output alternating voltage US measured at the terminal 23 first decreases to zero and then increases again. The difference between the voltages US and URK at the terminals 23 and 27, however, continuously increases, because after the passage through zero the phase of the voltage US at the electrode 11 is reversed. Consequently the output voltage of the differential amplifier continues to increase until the part of the disk 3 under the electrode 11 is fully polarized in the opposite sense.

The full hysteresis loop of the element 1 is utilized, because the state of polarization of the part of the storage element under the reference electrode 5 is not changed.

A signal A at the output 29 of the differential amplifier 25 can be converted to a direct voltage and be used to control an electronic potentiometer, for example for controlling the luminance or the volume or the contrast or the color saturation in a television receiver.

To prevent a direct current from leaking away via the input terminals 23 and 27 capacitors 31 and 33 respectively are provided. Such coupling capacitors may have a value of, say, 20 pF. In the embodiment described they should be smaller than the capacitance of the relevant storage electrode to which they are connected to prevent the time required for polarization reversal and hence this polarization reversal itself from being falsified.

Another embodiment is shown in FIG. 2. In this embodiment the capacitors 31 and 33 are connected to an input terminal 28 of an amplifier 26 and to a resistor 35. This resistor 35 may have an impedance of, for example, 2.7 k $\Omega$ while the capacitors 31 and 33 may each have a capacitance of 25 pF. The frequency of the driving oscillator 15 may be 250 kHz, and the capacitance of each electrode 5 and 11 may be of the order of 250 pF.

With the aforementioned values the capacitance CK of the capacitors 31 and 33 is much smaller than the capacitance of the storage electrode 11 and of the associated reference electrode 5 respectively, while the value of the resistor 35 is much smaller than $1/\omega CK$ so that the current flowing through the output circuit and the voltage UA across the resistor 35 are determined by the values of the capacitors 31 and 33 only. Starting from one end of the hysteresis loop, with full polarization under the storage electrode 11 the voltage UA is proportional to the sum of URK and US. If now depolarization is effected under the storage electrode 11, initially the voltage US will decrease so that UA also decreases until the passage through zero of the hystresis loop. From this point the phase of the voltage US is reversed and, although the voltage US increases, the reversed sign of the voltage US causes the sum of URK and US and hence the voltage UA to continue decreasing. Thus down to the lower point of saturation of the hysteresis loop the voltage US may increase in value so that the voltage UA continuously increases until it becomes zero. Here also the signal A appears at an output 32 of the amplifier 26 and may be used to control an electronic potentiometer in the aforedescribed manner. The value of the output voltage UA may be from 0 to 50 mV$_{eff}$.

Thus no steps to prevent the passage through zero of the alternating output voltage at the storage electrode 11 are required.

In the embodiment described the feedback electrode 5 is used as the reference electrode. However, it is not necessary for this feedback electrode to be used as the reference electrode. In many cases it is even preferable to use another storage electrode as the reference electrode, in which case obviously this reference electrode must satisfy the requirement that in the operational condition, i.e. with changes of the polarization values, the polarization under said reference electrode in the storage element 1 must be maintained at the initial value, i.e. must be maintained constant.

Alternatively synchronous detection of the voltage at the electrode 11 may be used and the output direct voltage of the synchronous detector may have a direct voltage superimposed on it such as to prevent a passage through zero.

Obviously the design of the alternating-voltage driving circuit which drives the electrode 4 is not of importance to the invention. For example, this driving circuit need not receive a feedback signal from the element 1.

What is claimed is:

1. An analog storage element, comprising:

a piezoferroelectric element having a driving electrode in contact with piezoferroelectric material for launching by piezoelectric effect an acoustic wave in said piezoferroelectric material, said piezoferroelectric element also having a reference electrode and at least one storage electrode in contact with said piezoferroelectric material, said reference electrode and said at least one storage electrode simultaneously detecting said acoustic wave by piezoelectric effect, the effective piezoelectric coefficient associated with each respective electrode being dependent upon the amount and polarity of polarization of the piezoferroelectric material adjacent to the respective electrode;

means electrically connected to said storage electrode for controllably applying thereto a d.c. voltage of either polarity sufficient to affect the amount and polarity of polarization of the piezoferroelectric material adjacent to said storage electrode, the polarization state of the piezoferroelectric material adjacent to said storage electrode representing stored analog information;

an a.c. voltage source means electrically connected to said driving electrode for launching in said piezoferroelectric element an acoustic wave corresponding thereto, the amplitude of said source being sufficiently low to not affect the polarization state of the piezoferroelectric material; and an output circuit electrically coupled to said reference and storage electrodes to produce an output signal which is a continuous function of the polarization state of the piezoferroelectric material adjacent to said storage electrode.

2. An analog storage circuit as defined in claim 1 wherein said output circuit comprises a differential amplifier.

3. An analog storage circuit as defined in claim 1 wherein said output circuit comprises a summation circuit.

4. An analog storage circuit as defined in claim 1 wherein said a.c. voltage source means comprises an oscillator and said reference electrode is electrically connected thereto for feedback.

5. An analog storage circuit as defined in claim 1 wherein said output circuit is coupled to said reference and storage electrodes via capacitors.

6. An analog storage circuit as defined in claim 5 wherein said reference and storage electrodes are connected to a summing point via capacitors having impedances sufficiently high to act as summing impedances.

* * * * *